(12) United States Patent
Scherer

(10) Patent No.: US 7,030,718 B1
(45) Date of Patent: Apr. 18, 2006

(54) APPARATUS AND METHOD FOR EXTENDING TUNING RANGE OF ELECTRO-ACOUSTIC FILM RESONATORS

(75) Inventor: Dieter Scherer, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 45 days.

(21) Appl. No.: 10/215,746

(22) Filed: Aug. 9, 2002

(51) Int. Cl.
*H03H 9/00* (2006.01)
*H03B 5/00* (2006.01)

(52) U.S. Cl. .................................. 333/188; 331/117 R (58) Field of Classification Search ................ 333/188, 333/189, 133, 187, 193, 197; 331/107 A, 331/155, 44, 116 R, 117 R, 177 V
See application file for complete search history.

(56) References Cited

U.S. PATENT DOCUMENTS

| | | | | |
|---|---|---|---|---|
| 2,596,460 A | * | 5/1952 | Arenberg | 333/197 |
| 3,735,286 A | * | 5/1973 | Vane | 331/101 |
| 4,550,293 A | * | 10/1985 | Driscoll | 331/116 R |
| 5,185,589 A | * | 2/1993 | Krishnaswamy et al. | 333/133 |
| 5,291,159 A | * | 3/1994 | Vale | 333/188 |
| 5,789,845 A | * | 8/1998 | Wadaka et al. | 310/334 |
| 5,905,418 A | * | 5/1999 | Ehara et al. | 333/193 |
| 6,051,907 A | * | 4/2000 | Ylilammi | 310/312 |
| 6,081,171 A | * | 6/2000 | Ella | 333/189 |
| 6,262,637 B1 | * | 7/2001 | Bradley et al. | 333/133 |
| 6,323,736 B1 | * | 11/2001 | Jansson | 331/44 |
| 6,407,649 B1 | * | 6/2002 | Tikka et al. | 333/133 |
| 6,469,586 B1 | * | 10/2002 | Rogers et al. | 331/117 R |
| 6,472,954 B1 | * | 10/2002 | Ruby et al. | 333/133 |
| 6,504,443 B1 | * | 1/2003 | Eguizabal | 331/177 V |
| 6,710,681 B1 | * | 3/2004 | Figueredo et al. | 333/187 |
| 6,774,746 B1 | * | 8/2004 | Whatmore et al. | 333/189 |
| 6,838,956 B1 | * | 1/2005 | Bradley | 333/189 |
| 6,885,260 B1 | * | 4/2005 | Nishimura et al. | 333/133 |
| 6,924,583 B1 | * | 8/2005 | Lin et al. | 310/324 |
| 6,936,837 B1 | * | 8/2005 | Yamada et al. | 257/2 |

* cited by examiner

*Primary Examiner*—Patrick Wamsley (57) ABSTRACT

A tuning circuit for adjusting an oscillation frequency of an oscillator circuit. The tuning circuit comprises a film bulk acoustic wave resonator (FBAR) having a series resonance frequency and a parallel resonance frequency, and an inductor coupled in series or parallel with the film bulk acoustic wave resonator. The series connection of the inductor and FBAR decreases the series resonance frequency. The parallel connection of the inductor and the FBAR increases the parallel resonance frequency. The tuning circuit further comprises a varactor coupled in series or parallel with the inductor and the FBAR combination. The varactor tunes the oscillation frequency over the increased tuning range.

20 Claims, 8 Drawing Sheets

APPARATUS AND METHOD FOR EXTENDING TUNING RANGE OF ELECTRO-ACOUSTIC FILM RESONATORS

TECHNICAL FIELD OF THE INVENTION

The present invention relates generally to high-frequency transceivers and, more particularly, to an apparatus and method for extending the tuning range of a local oscillator (LO) equipped with an electro-acoustic resonator for use in a high-frequency transceiver.

BACKGROUND OF THE INVENTION

Businesses and consumers use a wide array of high-frequency transmitters and receivers. These transmitter and receivers are used in unidirectional and bi-directional wireless devices (e.g., cell phones, wireless LAN cards, GPS devices), as well as unidirectional and bi-directional wireline devices (e.g., network interface cards). Increasingly, manufacturers of high-frequency communication devices are integrating most or all of the transmitter and receiver (generally, transceiver) circuitry onto a single integrated circuit die (i.e., chip) or at least onto a very small number of chips. As has been well reported, a number of technical obstacles have been encountered on the road to development of single chip transceivers.

One of these technical obstacles has been the tuning range, tuning accuracy, and phase noise of oscillator components in the transmitters and/or receivers. The core of many oscillators comprises some type of resonator device and associated tuning circuitry. The resonators include surface acoustic wave (SAW) resonators, microelectromechanical (MEM) resonators, and film bulk acoustic wave resonator (FBAR) devices.

FBAR devices are highly advantageous for use in oscillator applications because: 1) their high electro-acoustic coupling allows maximum frequency pulling, 2) their small size offers economic wafer fabrication and compact hybrid integrations and assembly; and 3) their planar process technology is most compatible with CMOS fabrication. Conventional varactor-tuned L/C circuits are less suitable because the resonant frequency and Q are defined by inaccurate and lossy inductor (L) and capacitor (C) components. FBAR devices are particularly useful for wireless transceiver applications.

Electro-acoustic RF resonators, as realized in film bulk acoustic wave resonator (FBAR) technology, exhibit a series resonance tightly followed by parallel resonance. Conventional techniques for tuning either resonance with a series or parallel variable capacitor, respectively, are limited to the spacing of the two resonances. Even an ideal varactor with a capacitance range from 0 picofarads (pF) to ∞ (infinite) pF cannot exceed these limits. A varactor with a typical Cmax/Cmin of 2.5 is able to pull either resonance frequency only a small fraction of the frequency spacing between F(parallel) and F(series). The foregoing limits the usefulness of FBAR devices in single chip transceiver applications.

Therefore, there is a need in the art for improved transmitters and receivers for use in high-frequency communication devices. In particular, there is a need in the art for high-frequency oscillators that are stable and accurate, while having a wide frequency tuning range. More particularly, there is a need for FBAR devices having a wide frequency tuning range for use in high-frequency transceiver oscillators.

SUMMARY OF THE INVENTION

The present invention overcomes the limitations described above by first increasing the spacing between the series resonance and parallel resonance of the film bulk acoustic wave resonator device using an external fixed inductance. The series resonance can be decreased (lowered) with an external series inductance and the parallel resonance can be increased (raised) with an external parallel inductance. Decreasing the series resonance is preferable in order to minimize parasitic reactances. A subsequently applied variable capacitor (varactor) is now able to pull either the series resonance or the parallel resonance over a greatly increased frequency range, thereby exceeding the initial spacing of the series and parallel resonances.

The increased range of frequency pulling is traded off for a lowered Q. However, a bank of multiple, switched resonator devices according to the principles of the present invention would achieve a high Q, as well as a wide tuning range. Advantageously, FBAR devices may be integrated on prefabricated CMOS wafers.

To address the above-discussed deficiencies of the prior art, it is a primary object of the present invention to provide, for use in an oscillator circuit, a tuning circuit for adjusting an oscillation frequency of the oscillator circuit. According to a first advantageous embodiment of the present invention, the tuning circuit comprises: 1) a film bulk acoustic wave resonator having a series resistance frequency and a parallel resonance frequency associated therewith; 2) an inductor coupled in series to a first input of the film bulk acoustic wave resonator, the series connection of the inductor and the film bulk acoustic wave resonator operable to decrease the series resonance frequency; and 3) a tuning capacitor coupled in parallel with the series connection of the inductor and the film bulk acoustic wave resonator, the tuning capacitor operable to tune the oscillation frequency between the decreased series resonance frequency and the parallel resonance frequency.

According to a second advantageous embodiment of the present invention, the tuning circuit comprises: 1) a film bulk acoustic wave resonator having a series resonance frequency and a parallel resonance frequency associated therewith; 2) an inductor coupled in series to a first input of the film bulk acoustic wave resonator, the series connection of the inductor and the film bulk acoustic wave resonator operable to decrease the series resonance frequency; and 3) a tuning capacitor coupled in series with the series connection of the inductor and the film bulk acoustic wave resonator, the tuning capacitor operable to tune the oscillation frequency between the decreased series resonance frequency and the parallel resonance frequency.

According to a third advantageous embodiment of the present invention, the tuning circuit comprises: 1) a film bulk acoustic wave resonator having a series resonance frequency and a parallel resonance frequency associated therewith; 2) an inductor coupled in parallel between a first input and a second input of the film bulk acoustic wave resonator, the parallel connection of the inductor and the film bulk acoustic wave resonator operable to increase the parallel resonance frequency; and 3) a tuning capacitor coupled in parallel with the parallel connection of the inductor and the film bulk acoustic wave resonator, the tuning capacitor operable to tune the oscillation frequency between the increased parallel resonance frequency and the series resonance frequency.

According to a fourth advantageous embodiment of the present invention, the tuning circuit comprises: 1) a film bulk acoustic wave resonator having a series resonance frequency and a parallel resonance frequency associated therewith; 2) an inductor coupled in parallel between a first input and a second input of the film bulk acoustic wave resonator, the parallel connection of the inductor and the film bulk acoustic wave resonator operable to increase the parallel resonance frequency; and 3) a tuning capacitor coupled in series with the parallel connection of the inductor and the film bulk acoustic wave resonator, the tuning capacitor operable to tune the oscillation frequency between the increased parallel resonance frequency and the series resonance frequency.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. In particular, a controller may comprise a data processor and an associated memory that execute one or more functions associated with the present invention. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged communication device.

Figure 1:
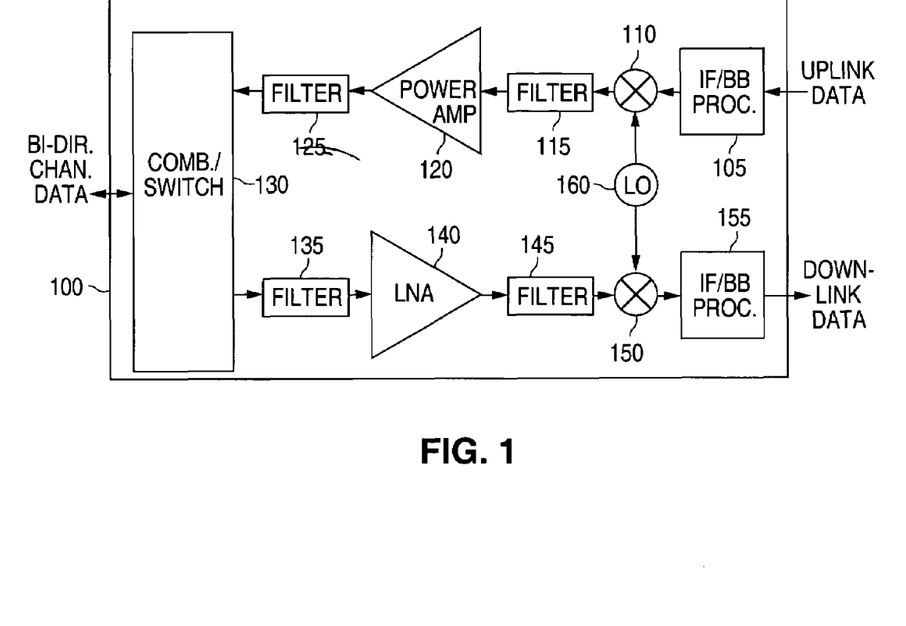
FIG. 1 illustrates an exemplary transceiver having a local oscillator (LO) containing a film bulk acoustic-wave resonator (FBAR) according to one embodiment of the present invention.

FIG. 1 illustrates exemplary transceiver 100 having local oscillator (LO) 160 containing a film bulk acoustic-wave resonator (FBAR) according to one embodiment of the present invention. Transceiver 100 comprises a transmit path and a receive path. The transmit path comprises intermediate frequency-baseband (IF-BB) processing block 105, mixer 110, filter 115, power amplifier 120, and filter 125. The receive path comprises filter 135, low-noise amplifier (LNA) 140, filter 145, mixer 150 and intermediate frequency-baseband (IF-BB) processing block 155. Local oscillator (LO) 160 generates a reference signal having a tunable frequency, LO, that is applied to mixer 110 in the transmit path and to mixer 150 in the receive path.

Transceiver 100 is intended to be a generic representation of a transceiver, without regard to whether transceiver 100 is used in a wireless application or a wireline application. Thus, transceiver 100 may be part of a cellular telephone, a pager, a Gigabit Ethernet network interface card (NIC) suitable for use with a wireline LAN, or the like. Transceiver 100 communicates through a bi-directional channel, such as cabling (wireline application) or the air (wireless application). The transmit and receive paths are coupled to the bi-directional channel by means of combiner-switch 130. In a wireless application, combiner-switch 130 may be, for example, a duplexer that couples the transmit and receive paths to an antenna array. In a wireline application, combiner-switch 130 may be a switch that alternates between transmit and receive paths, depending on the mode of transceiver 100.

In the receive path, incoming bi-directional channel data is transferred to filter 135 by combiner-switch 130. Filter 135 isolates the frequencies of interest. LNA 140 then amplifies the filtered output from filter 135. Filter 145 further isolates the frequencies of interest and filters out noise components introduced by LNA 140. The filtered, high-frequency output of filter 145 is then down-converted by mixer 150 using the LO signal received from LO 160. The down-converted output (either intermediate frequency (IF) or baseband) is then processed by IF-BB processing block 155 to produce the final downlink data that was transmitted. The nature of IF-BB processing block 155 varies according to the type of system (i.e., NIC, cell phone, GPS device) in which transceiver 100 is incorporated.

In the transmit path, uplink data is processed by IF-BB processing block 105 in a manner analogous to IF-BB processing block 155. The output of IF-BB processing block 105 is then up-converted by mixer 110 using the LO signal received from LO 160. The high-frequency output of mixer 110 is filtered by filter 115 to isolate the frequencies of interest and to filter out noise components introduced by mixer 110. Power amplifier 120 then amplifies the filtered signal. The amplified signal is filtered again by filter 125 to filter out noise components introduced by power amplifier 120. Finally, the filtered, amplified high-frequency signal is transferred to the bi-directional channel by combiner-switch 130.

Figure 2A:
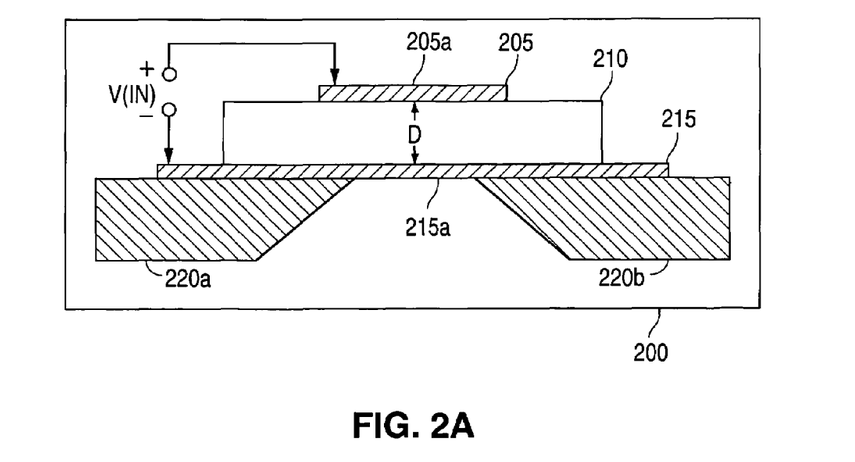
FIG. 2A illustrates a conventional film bulk acoustic-wave resonator (FBAR)

FIG. 2A illustrates conventional film bulk acoustic-wave resonator (FBAR) 200. The nature and operation of FBAR 200 is well known to those skilled in the art. FBAR 200 comprises upper electrode 205 and lower electrode 215, which are separated by piezo-electric layer 210. Silicon layer 220 supports lower electrode 215. Surface 215a of lower electrode 215 and surface 205a of upper electrode 205 both border on free space.

When FBAR 200 is used as a resonator in an oscillator circuit, a voltage V(IN) is applied between upper electrode 205 and lower electrode 215. Piezo-electric layer 210 has a thickness, D, equal to one-half of a wavelength ($\lambda$) of the piezo-electric material:

$$D = \frac{1}{2}\lambda = \frac{1}{2}v/f$$

Figure 2B:
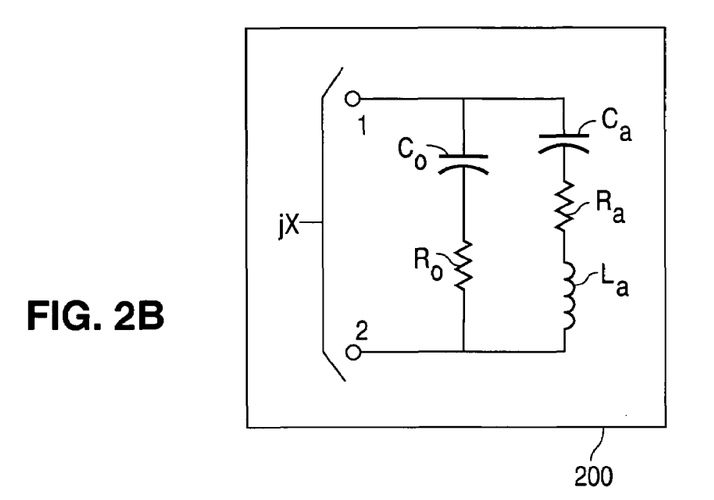
FIG. 2B illustrates an equivalent circuit of the conventional film bulk acoustic-wave resonator (FBAR) illustrated in FIG. 2B.

For example, if the piezo-electric material is aluminum nitride (AlN), the wave velocity, v, is approximately 11,300 meters per second and D is 2.8 microns ($\mu$m) for f=2 GHz. Similarly, if the piezo-electric material is zinc oxide (ZnO), the wave velocity, v, is about 6,080 meters per second and D is 1.5 microns ($\mu$m) for a 2 GHz wave FIG. 2B illustrates an equivalent circuit for conventional film bulk acoustic-wave resonator (FBAR) 200 illustrated in FIG. 2A. FBAR 200 is a one port device having an Input 1 and an Input 2. The equivalent circuit comprises a first series combination of a capacitor, $C_o$, and its associated resistance, $R_o$. For most cases, $R_o$, is assumed to be 0 ohms and can be omitted. The first series combination is in parallel with a second series combination of capacitor, $C_a$, and it associated resistance, $R_a$, and inductance, $L_a$.

The series resonance frequency, $\omega_s$, and $Q_s$, of FBAR 200 are given by:

$$\omega^2_s = 1/L_a C_a \qquad \text{[Eqn. 1]}$$

$$Q_s = 1/\omega_s C_a R_a. \qquad \text{[Eqn. 2]}$$

The parallel resonance frequency, $\omega_p$, and $Q_p$ of FBAR 200 are given by:

$$\omega^2_p = (1+C_a/C_o)/L_a C_a \qquad \text{[Eqn. 3]}$$

$$Q_p = (1+C_a/C_o)/\omega_p C_a (R_a+R_o). \qquad \text{[Eqn. 4]}$$

Additionally, since $\omega = 2\pi f$, $$f_p = f_s(1+C_a/C_o)^{1/2} \qquad \text{[Eqn. 5]}$$

$$(f_p-f_s)/f_s \cong \frac{1}{2}(C_a/C_o). \qquad \text{[Eqn. 6]}$$

The term $(f_p-f_s)/f_s$ establishes the maximum achievable filter bandwidth.

Figure 3:
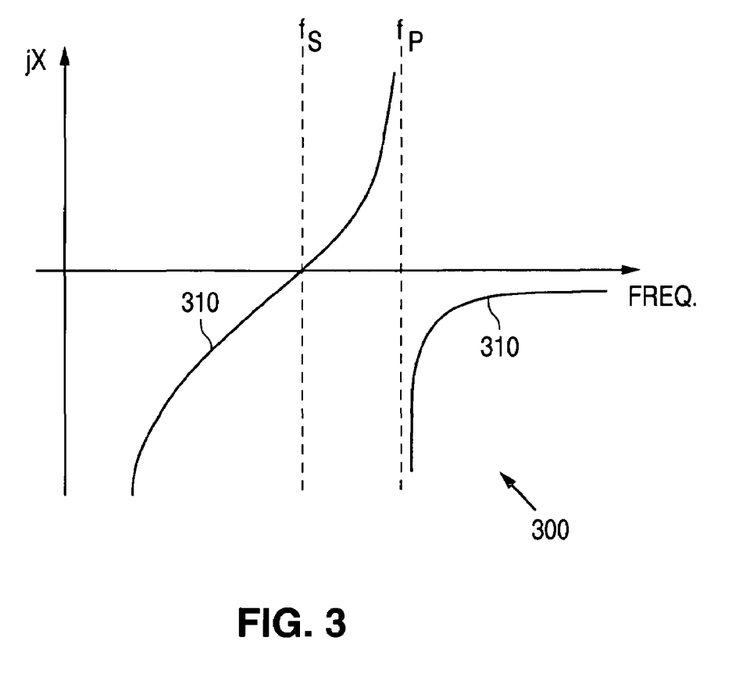
FIG. 3 illustrates a graph of reactance (jX) versus frequency for the conventional film bulk acoustic-wave resonator (FBAR) illustrated in FIGS. 2A and 2B.

FIG. 3 illustrates graph 300 of reactance (jX) versus frequency for film bulk acoustic-wave resonator (FBAR) 200 illustrated in FIGS. 2A and 2B. According to an exemplary embodiment of FBAR 200, the components of FBAR 200 are assumed to have the values:

$C_O$=1.91 pF
$R_o$=0.00 ohms
$C_a$=0.08 pF
$R_a$=1.14 ohms
$L_a$=123.6 nH

Substituting these values into Equations 1–6 above, gives $f_s$=1,601 MHz and $f_p$=1,634 MHz. The value of $f_s$ is given by the intersection of curve 310 and the horizontal axis (i.e., jX= 0). The value of $f_p$ is the intersection of the vertical asymptote between the two portions of curve 310 and the horizontal axis.

Figure 4A:
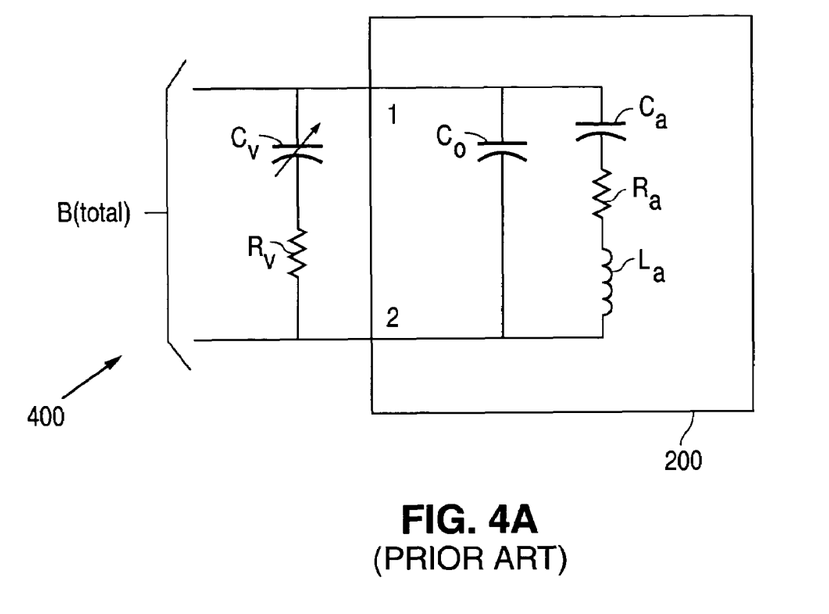
FIG. 4A illustrates a conventional varactor tuning circuit for changing the parallel resonance of the conventional film bulk acoustic-wave resonator (FBAR) according to a first embodiment of the prior art.

FIG. 4A illustrates conventional variable capacitor (varactor) tuning circuit 400 for changing the parallel resonance of film bulk acoustic-wave resonator (FBAR) 200 according to a first embodiment of the prior art. Varactor, $C_v$, and its associated resistance, $R_v$, are shown in series with each other and form a parallel connection across the port of FBAR 200 (i.e., between Input 1 and Input 2).

Figure 4B:
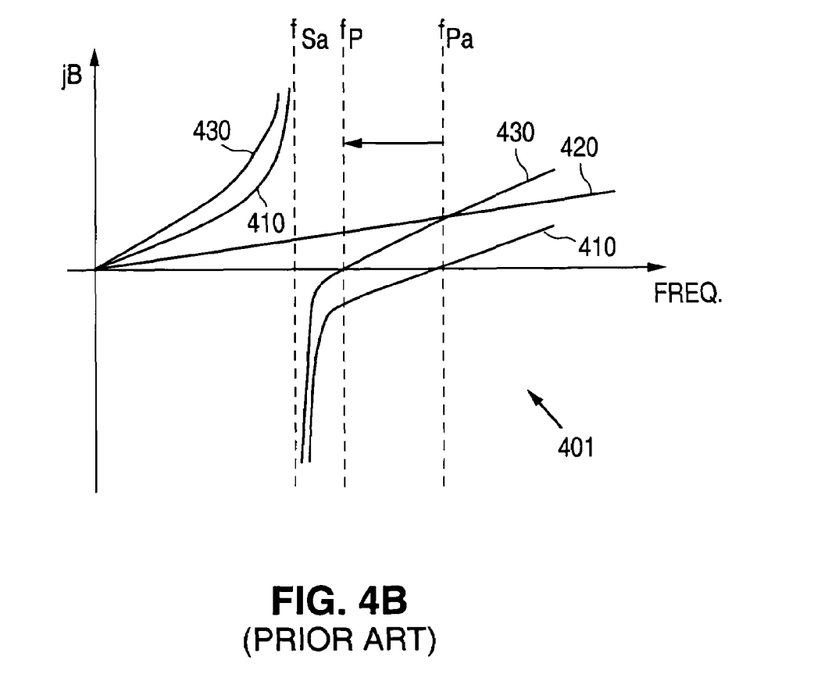
FIG. 4B illustrates a graph of susceptance (jB) of the conventional varactor tuning circuit in FIG. 4A.

FIG. 4B illustrates graph 401 of susceptance (jB) of conventional varactor tuning circuit 400 in FIG. 4A as a function of tuning frequency. Curve 410 represents the susceptance ($jB_{FBAR}$) of FBAR 200. Curve 420 represents the susceptance ($jB_{CVAR}$) of varactor $C_v$. Curve 430 represents the total susceptance ($jB_{Total}$). Even for an ideal varactor $C_v$ that can be tuned from 0 pF to $\infty$ pF, the maximum tuning range of parallel resonance, $f_p$, is from $f_{Pa}$ to $f_{Sa}$ (the letter "a" in the subscript means "acoustic"). The series resonance remains fixed at $f_{Sa}$. This range is too narrow to be of practical use for local oscillators.

Figure 5A:
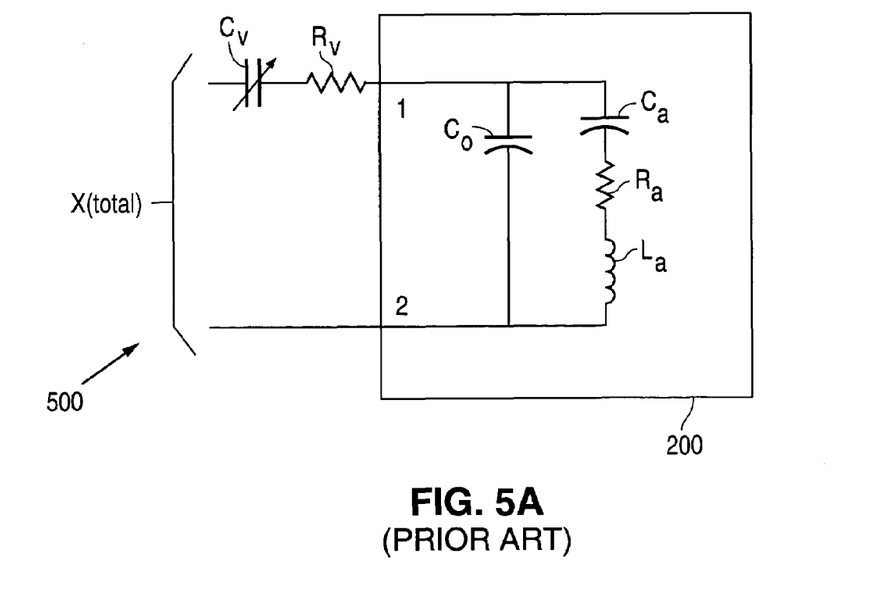
FIG. 5A illustrates a conventional varactor tuning circuit for changing the series resonance of the conventional thin film bulk acoustic-wave resonator (FBAR) according to a second embodiment of the prior art.

FIG. 5A illustrates conventional varactor tuning circuit 500 for changing the series resonance of thin film bulk acoustic-wave resonator (FBAR) 200 according to a second embodiment of the prior art. Varactor, $C_v$, and its associated resistance, $R_v$, are shown in series with each other and form a series connection with Input 1 of the port of FBAR 200.

Figure 5B:
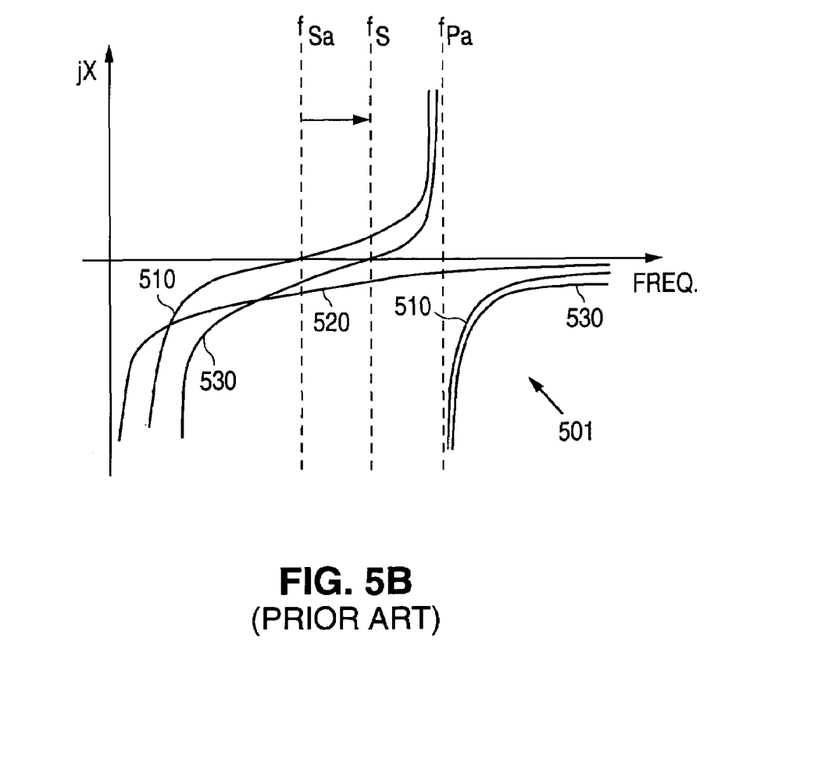
FIG. 5B illustrates a graph of reactance (jX) of the conventional varactor tuning circuit in FIG. 5A.

FIG. 5B illustrates graph 501 of reactance (jX) of conventional varactor tuning circuit 500 in FIG. 5A as a function of tuning frequenccy. Curve 510 represents the reactance ($jX_{FBAR}$) of FBAR 200. Curve 520 represents the reactance ($jX_{CVAR}$) of varactor $C_v$. Curve 530 represents the total reactance ($jX_{Total}$). Even for an ideal varactor $C_v$, that can be tuned from 0 pF to $\infty$ pF, the maximum tuning range of series resonance, $f_S$, is from $f_{Sa}$ to $f_{Pa}$. The parallel resonance remains fixed at $f_{Pa}$. Again, this range is too narrow to be of practical use for local oscillators.

Figure 6A:
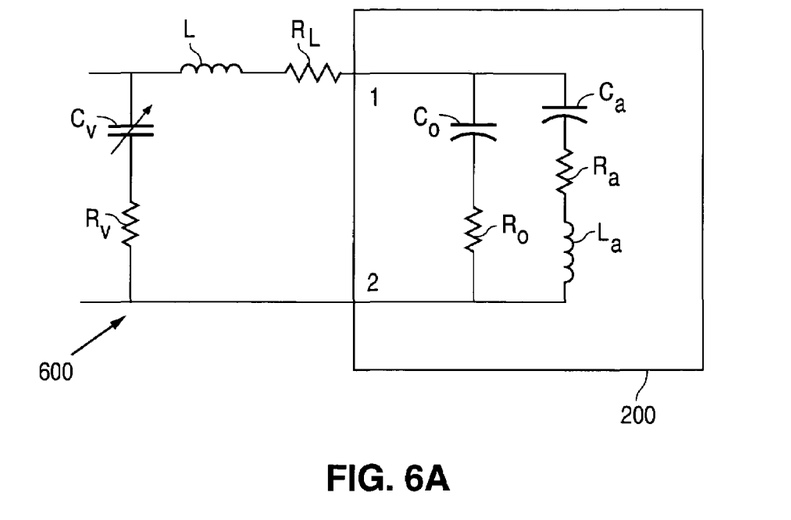
FIG. 6A illustrates a tuning circuit for extending the parallel resonance tuning range of the conventional film bulk acoustic-wave resonator (FBAR) using an external series inductance according to a first embodiment of the present invention.

FIG. 6A illustrates tuning circuit 600 for extending the parallel resonance tuning range of film bulk acoustic-wave resonator (FBAR) 200 using external series inductance, L, according to a first embodiment of the present invention. In FIG. 6A, inductor L and its associated resistance, $R_L$, are shown in series with Input 1 of FBAR 200. Varactor, $C_v$, and its associated resistance, $R_v$, are shown in series with each other and are connected in parallel with the series connection of inductor L and FBAR 200.

Figure 6B:
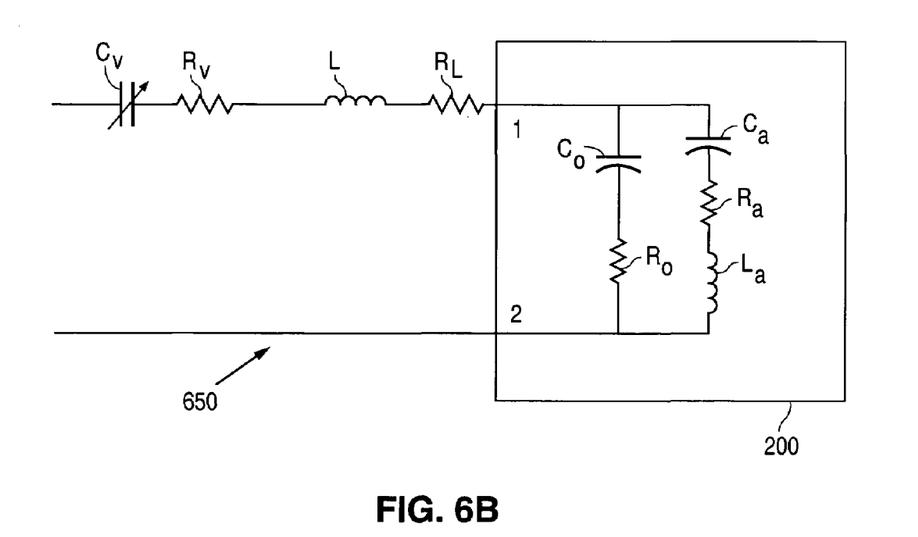
FIG. 6B illustrates a tuning circuit for extending the series resonance tuning range of the conventional thin film bulk acoustic-wave resonator (FBAR) using an external series inductance according to a second embodiment of the present invention.

FIG. 6B illustrates tuning circuit 650 for extending the series resonance tuning range of film bulk acoustic-wave resonator (FBAR) 200 using external series inductance, L, according to a second embodiment of the present invention. In FIG. 6B, inductor L and its associated resistance, $R_L$, are shown in series with Input 1 of FBAR 200. Also, varactor, $C_v$, and its associated resistance, $R_v$, are shown in series with each other and in series with inductor L and FBAR 200.

Figure 7A:
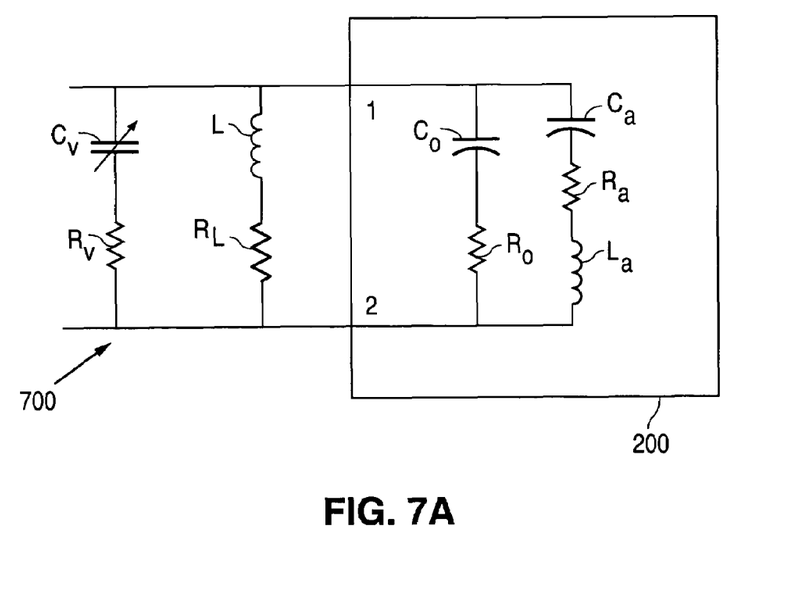
FIG. 7A illustrates a tuning circuit for extending the parallel resonance tuning range of the conventional film bulk acoustic-wave resonator (FBAR) using an external parallel inductance according to a third embodiment of the present invention.

FIG. 7A illustrates tuning circuit 700 for extending the parallel resonance tuning range of film bulk acoustic-wave resonator (FBAR) 200 using external parallel inductance, L, according to a third embodiment of the present invention. In FIG. 7A, inductor L and its associated resistance, $R_L$, are shown in series with each other and are connected in parallel across Input 1 and Input 2 of FBAR 200. Similarly, varactor, $C_v$, and its associated resistance, $R_v$, are shown in series with each other and are connected in parallel across Input 1 and Input 2 of FBAR 200.

Figure 7B:
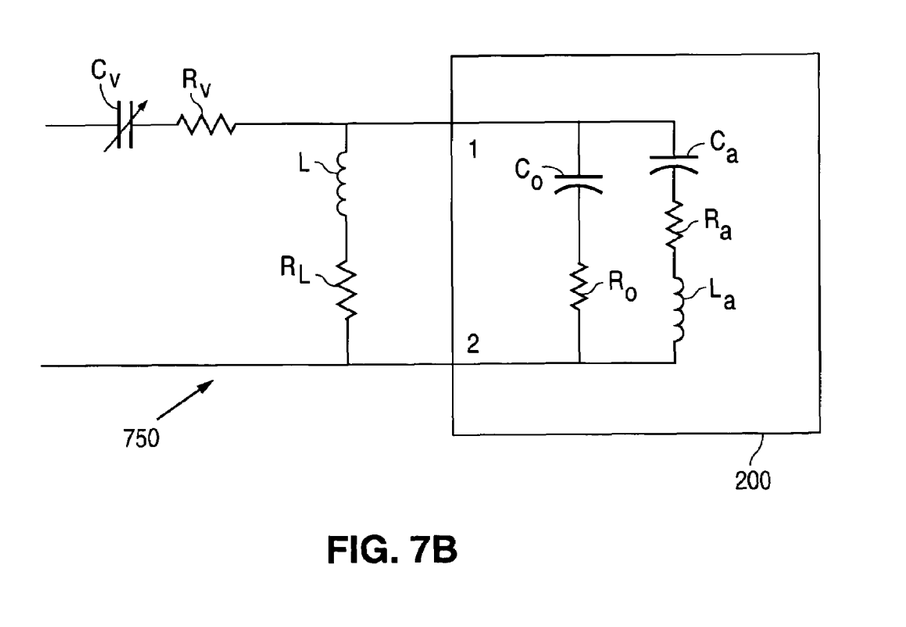
FIG. 7B illustrates a tuning circuit for extending the series resonance tuning range of the conventional film bulk acoustic-wave resonator (FBAR) using an external parallel inductance according to a fourth embodiment of the present invention.

FIG. 7B illustrates tuning circuit 750 for extending the series resonance tuning range of film bulk acoustic-wave resonator (FBAR) 200 using external parallel inductance, L, according to a fourth embodiment of the present invention. In FIG. 7B, inductor L and its associated resistance, $R_L$, are shown in series with each other and are connected in parallel across Input 1 and Input 2 of FBAR 200. However, varactor, $C_v$, and its associated resistance, $R_v$, are shown in series with each other and are connected in series with the parallel combination of inductor L and FBAR 200.

Each one of tuning circuits 600, 650, 700 and 750 is capable of extending the tuning range of FBAR 200 by increasing the spacing between the series resonance and parallel resonance of the FBAR 200 using the external fixed inductance, L. The series resonance can be lowered with external series inductance, L, as shown in tuning circuits 600 and 650. The parallel resonance can be increased with external parallel inductance, L, as shown in tuning circuits 700 and 750. The variable capacitor, $C_v$, then pulls either the series resonance or the parallel resonance over a greatly increased frequency range, thereby exceeding the initial spacing of the series and parallel resonances.

Figure 8:
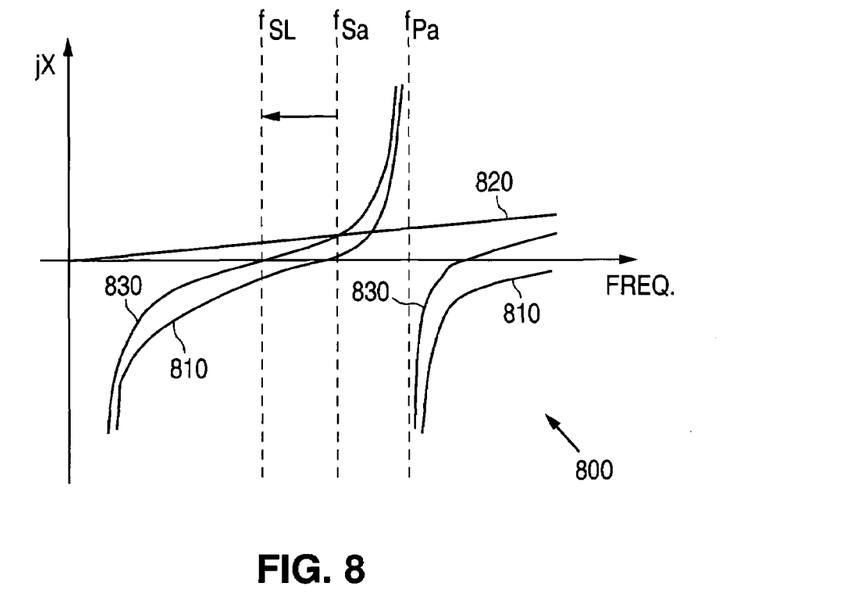
FIG. 8 illustrates a graph showing the effect on series resonance of the conventional film bulk acoustic-wave resonator (FBAR) caused by adding the external series inductance in FIG. 6A.
Figure 9:
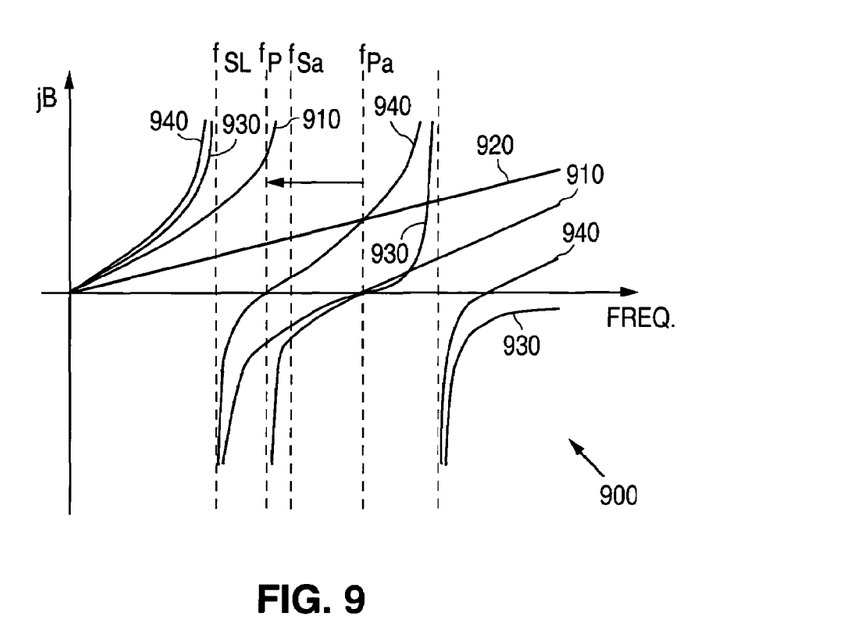
FIG. 9 illustrates a graph showing the effect on parallel resonance of the conventional film bulk acoustic-wave resonator (FBAR) caused by adding the varactor in FIG. 6A.
Figure 10:
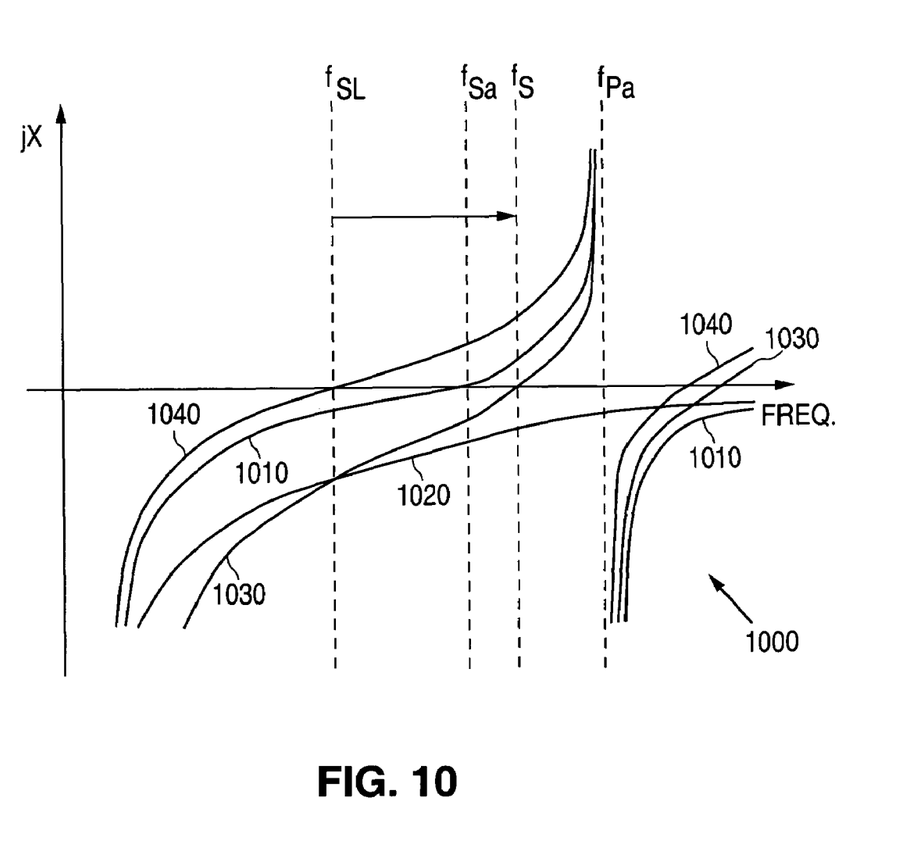
FIG. 10 illustrates a graph showing the effect on series resonance of the conventional film bulk acoustic-wave resonator (FBAR) caused by adding the varactor in FIG. 6B.

However, lowering the series resonance is preferable in order to reduce the required inductor size and to minimize parasitic reactances. In FIGS. 6A and 6B, the required external series inductor, L, is in the range of, for example, 2 nanohenries (nH) to 8 nH for applications around 2 GHz. In FIGS. 7A and 7B, the required external parallel inductor, L, is of similar value. However, the series inductor L in FIGS. 6A and 6B also serves to make the necessary connection to the remainder of the oscillator circuit without introducing any unwanted reactance. Integrating the circuit of FIG. 7A or 7B with the oscillator circuit also requires a series inductor, which would be unwanted parasitic reactance in this case. Therefore, tuning circuits 600 and 650 in FIGS. 6A and 6B are preferable to tuning circuits 700 and 750 in FIGS. 7A and 7B. FIGS. 8–10 below illustrate the improved tuning ranges of tuning circuits 600 and 650.

FIG. 8 illustrates graph 800, which shows the effect on series resonance of film bulk acoustic-wave resonator (FBAR) 200 caused by adding external series inductance, L, in FIG. 6A. In FIG. 8, it is assumed that varactor $C_v$ is not initially present in tuning circuit 600. Curve 810 represents the reactance ($jX_{FBAR}$) of FBAR 200. Curve 820 represents the reactance ($jX_L$) of inductor L. Curve 830 represents the total reactance ($jX_{Total}$). As FIG. 8 illustrates, addition of inductor L lowers the series resonance from $f_{Sa}$ to $f_{SL}$.

FIG. 9 illustrates graph 900, which shows the effect on parallel resonance of film bulk acoustic-wave resonator (FBAR) 200 caused by adding the varactor $C_v$ to tuning circuit 600 in FIG. 6A. Curve 910 represents the susceptance ($jB_{FBAR}$) of FBAR 200. Curve 920 represents the susceptance ($jB_{CVAR}$) of the varactor $C_v$. Curve 930 represents the susceptance ($jB_L$) of the FBAR 200 including inductor L. Curve 940 represents the total susceptance ($jB_{Total}$). As FIG. 9 illustrates, addition of varactor $C_v$ to tuning circuit 600 including inductor L allows the parallel resonance to be pulled down below the initial series resonance $f_{Sa}$.

With respect to FIG. 10, if varactor $C_v$ is not initially present in tuning circuit 650, the effect on resonance of FBAR 200 by adding inductor L is the same as shown in FIG. 8, since tuning circuits 600 and 650 are identical if varactor $C_v$ is removed. After addition of varactor $C_v$, however, FIG. 10 applies. FIG. 10 illustrates graph 1000, which shows the effect on series resonance of film bulk acoustic-wave resonator (FBAR) 200 including inductor L caused by adding varactor $C_v$ to tuning circuit 650 in FIG. 6B.

Curve 1010 represents the reactance ($jX_{FBAR}$) of FBAR 200. Curve 1020 represents the reactance ($jX_{CVAR}$) of the varactor $C_V$. Curve 1040 represents the reactance ($jX_L$) of FBAR 200 including the inductor L. Curve 1030 represents the total reactance ($jX_{Total}$). FIG. 10 illustrates how the addition of varactor $C_V$ to tuning circuit 650 permits tuning of the series resonance from $f_{SL}$ to a frequency above the initial series resonance $f_{Sa}$, thereby giving a much greater tuning range.

Although the present invention has been described with several embodiments, various changes and modifications may be suggested to one skilled in the art. It is intended that the present invention encompass such changes and modifications as fall within the scope of the appended claims.

What is claimed is:

1. For use in an oscillator circuit, a tuning circuit for adjusting an oscillation frequency of said oscillator circuit comprising:
    a film bulk acoustic wave resonator having a series resonance frequency and a parallel resonance frequency associated therewith;
    an inductor coupled in parallel between a first input and a second input of said film bulk acoustic wave resonator, said parallel connection of said inductor and said film bulk acoustic wave resonator operable to increase said parallel resonance frequency; and
    a tuning capacitor coupled in parallel with said parallel connection of said inductor and said film bulk acoustic wave resonator, said tuning capacitor operable to tune said oscillation frequency between said increased parallel resonance frequency and said series resonance frequency.

2. The tuning circuit of claim 1, wherein:
    the film bulk acoustic wave resonator comprises a first electrode and a second electrode separated by a piezoelectric layer, a surface of the first electrode and a portion of a surface of the second electrode bordering on free space; and the piezo-electric layer has a thickness equal to one-half of a wavelength of piezo-electric material in the piezo-electric layer.

3. The tuning circuit as set forth in claim 2 wherein said piezo-electric layer comprises one of: aluminum nitride and zinc oxide.

4. The tuning circuit as set forth in claim 1 wherein said tuning capacitor is a varactor.

5. The tuning circuit as set forth in claim 1 wherein said inductor comprises an associated resistance $R_L$.

6. The tuning circuit as set forth in claim 1 wherein said tuning capacitor comprises an associated resistance $R_V$.

7. A communication device comprising:
   at least one of:
      transmit path circuitry operable to receive an uplink data stream and upconvert said uplink data stream to a higher frequency signal for subsequent transmission through a communication channel; and
      receive path circuitry operable to receive a high-frequency signal from said communication channel and downconvert said high-frequency signal to a lower frequency downlink data stream;
   an oscillator circuit associated with said at least one of said transmit path circuitry and said receive path circuitry, said oscillator circuit comprising a tuning circuit for adjusting an oscillation frequency of said oscillator circuit, wherein said tuning circuit comprises:
   a film bulk acoustic wave resonator having a series resonance frequency and a parallel resonance frequency associated therewith;
   an inductor coupled in parallel between a first input and a second input of said film bulk acoustic wave resonator, said parallel connection of said inductor and said film bulk acoustic wave resonator operable to increase said parallel resonance frequency; and
   a tuning capacitor coupled in parallel with said parallel connection of said inductor and said film bulk acoustic wave resonator, said tuning capacitor operable to tune said oscillation frequency between said increased parallel resonance frequency and said series resonance frequency.

8. The communication device of claim 7, wherein:
   the film bulk acoustic wave resonator comprises a first electrode and a second electrode separated by a piezo-electric layer, a surface of the first electrode and a portion of a surface of the second electrode bordering on free space; and
   the piezo-electric layer has a thickness equal to one-half of a wavelength of piezo-electric material in the piezo-electric layer.

9. The communications device as set forth in claim 8 wherein said piezo-electric layer comprises one of: aluminum nitride and zinc oxide.

10. The communication device as set forth in claim 7 wherein said tuning capacitor is a varactor.

11. The communication device of claim 7, wherein:
    the transmit path circuitry comprises:
       a first intermediate frequency-baseband processing block;
       a first mixer coupled to the first intermediate frequency-baseband processing block;
       a first filter coupled to the first mixer;
       a power amplifier coupled to the first filter; and
       a second filter coupled to the power amplifier; and
    the receive path circuitry comprises:
       a third filter;
       a low noise amplifier coupled to the third filter;
       a fourth filter coupled to the low noise amplifier;
       a second mixer coupled to the fourth filter; and
       a second intermediate frequency-baseband processing block coupled to the second mixer.

12. The communications device as set forth in claim 7 wherein said inductor comprises an associated resistance $R_L$.

13. The communications device as set forth in claim 7 wherein said tuning capacitor comprises an associated resistance $R_V$.

14. For use in an oscillator containing a film bulk acoustic wave resonator (FBAR) having a series resonance frequency and a parallel resonance frequency associated therewith, a method of increasing the tuning range of the FBAR comprising the steps of:
    increasing the parallel resonance frequency by coupling an inductor in parallel between a first input and a second input of the FBAR; and
    coupling a tuning capacitor in parallel with the parallel connection of the inductor and the film bulk acoustic wave resonator, wherein the tuning capacitor is operable to tune the oscillation frequency between the increased parallel resonance frequency and the series resonance frequency.

15. The method of claim 14, wherein:
    the film bulk acoustic wave resonator comprises a first electrode and a second electrode separated by a piezo-electric layer, a surface of the first electrode and a portion of a surface of the second electrode bordering on free space; and
    the piezo-electric layer has a thickness equal to one-half of a wavelength of piezo-electric material in the piezo-electric layer.

16. The method as set forth in claim 15 wherein said piezo-electric layer comprises one of: aluminum nitride and zinc oxide.

17. The method as set forth in claim 14 further comprising the step of:
    tuning said oscillation frequency of said film bulk acoustic wave resonator between said increased parallel resonance frequency and said series resonant frequency.

18. The method as set forth in claim 14 wherein said tuning capacitor comprises a varactor.

19. The method as set forth in claim 14 wherein said inductor comprises an associated resistance $R_L$.

20. The method as set forth in claim 14 wherein said tuning capacitor comprises an associated resistance $R_V$.

* * * * *